US010332920B2

(12) United States Patent
Evans, V et al.

(10) Patent No.: US 10,332,920 B2
(45) Date of Patent: Jun. 25, 2019

(54) HOLLOWED ELECTRONIC DISPLAY

(71) Applicant: Essential Products, Inc., Palo Alto, CA (US)

(72) Inventors: David John Evans, V, Palo Alto, CA (US); Xinrui Jiang, San Jose, CA (US); Andrew E. Rubin, Los Altos, CA (US); Matthew Hershenson, Los Altos, CA (US); Xiaoyu Miao, Palo Alto, CA (US); Joseph Anthony Tate, San Jose, CA (US); Jason Sean Gagne-Keats, Cupertino, CA (US); Rebecca Schultz Zavin, Portola Valley, CA (US)

(73) Assignee: ESSENTIAL PRODUCTS, INC., Palo Alto, CA (US)

( * ) Notice: Subject to any disclaimer, the term of this patent is extended or adjusted under 35 U.S.C. 154(b) by 0 days.

(21) Appl. No.: 15/832,079

(22) Filed: Dec. 5, 2017

(65) Prior Publication Data

US 2018/0097022 A1 Apr. 5, 2018

Related U.S. Application Data

(63) Continuation of application No. 15/625,686, filed on Jun. 16, 2017, now Pat. No. 9,881,943, which is a
(Continued)

(51) Int. Cl.
*F21V 8/00* (2006.01)
*G02B 5/20* (2006.01)
(Continued)

(52) U.S. Cl.
CPC .......... *H01L 27/1262* (2013.01); *G02B 5/201* (2013.01); *G02B 5/3033* (2013.01);
(Continued)

(58) Field of Classification Search
CPC .......................... H01L 27/1262; G02F 1/1341
(Continued)

(56) References Cited

U.S. PATENT DOCUMENTS 6,387,043 B1 5/2002 Yoon
2004/0212555 A1 10/2004 Falco
(Continued)

FOREIGN PATENT DOCUMENTS

JP 2000162589 A 6/2000
JP 2000187209 A 7/2000
(Continued)

OTHER PUBLICATIONS

Corrected Notice of Allowability dated Jun. 16, 2017 in U.S. Appl. No. 15/233,818 of Evans V, D. et al. filed Aug. 10, 2016, 2 pages.
(Continued)

*Primary Examiner* — Bo Fan
(74) *Attorney, Agent, or Firm* — Perkins Coie LLP

(57) ABSTRACT

Presented here are manufacturing techniques to create an irregularly shaped electronic display, including a hollow within which a sensor, such as a camera, can be placed. The manufacturing techniques enable the creation of the hollow anytime during the manufacturing process. The resulting electronic display occupies the full side of the mobile device, with the sensors placed within and surrounded by the display.

20 Claims, 10 Drawing Sheets

Related U.S. Application Data continuation of application No. 15/233,818, filed on Aug. 10, 2016, now Pat. No. 9,735,185.

(60) Provisional application No. 62/348,421, filed on Jun. 10, 2016.

(51) Int. Cl.
| | |
|---|---|
| *G02B 5/30* | (2006.01) |
| *G06F 1/16* | (2006.01) |
| *G02B 26/08* | (2006.01) |
| *G02F 1/133* | (2006.01) |
| *H01L 27/12* | (2006.01) |
| *G02F 1/1333* | (2006.01) |
| *G02F 1/1335* | (2006.01) |
| *G02F 1/1339* | (2006.01) |
| *G02F 1/1341* | (2006.01) |
| *G02F 1/1343* | (2006.01) |
| *G02F 1/1362* | (2006.01) |
| *G02F 1/1368* | (2006.01) |

(52) U.S. Cl.
CPC ....... *G02B 6/0051* (2013.01); *G02B 26/0833* (2013.01); *G02F 1/1333* (2013.01); *G02F 1/1339* (2013.01); *G02F 1/1341* (2013.01); *G02F 1/1362* (2013.01); *G02F 1/1368* (2013.01); *G02F 1/13318* (2013.01); *G02F 1/133504* (2013.01); *G02F 1/133514* (2013.01); *G02F 1/133528* (2013.01); *G02F 1/134336* (2013.01); *G06F 1/1605* (2013.01); *G06F 1/1686* (2013.01); *G02F 2001/13312* (2013.01); *G02F 2001/134345* (2013.01); *G02F 2201/56* (2013.01)

(58) Field of Classification Search
USPC ..................................... 257/72, 618; 438/24
See application file for complete search history.

(56) References Cited

U.S. PATENT DOCUMENTS

| | | | |
|---|---|---|---|
| 2006/0007222 | A1 | 1/2006 | Uy |
| 2007/0066902 | A1* | 3/2007 | Wilser ................ A61B 8/12 600/459 |
| 2007/0275497 | A1 | 11/2007 | Kwack et al. |
| 2008/0261127 | A1 | 10/2008 | Progler |
| 2008/0284719 | A1 | 11/2008 | Yoshida et al. |
| 2010/0315570 | A1 | 12/2010 | Mathew et al. |
| 2010/0330799 | A1* | 12/2010 | Hamanaka ........ H01L 21/7682 438/618 |
| 2012/0105400 | A1 | 5/2012 | Mathew et al. |
| 2012/0147303 | A1 | 6/2012 | Yamada et al. |
| 2012/0267733 | A1* | 10/2012 | Hu ...................... H01L 43/08 257/421 |
| 2013/0170116 | A1 | 7/2013 | In et al. |
| 2014/0117476 | A1 | 5/2014 | Kuo et al. |
| 2014/0225131 | A1 | 8/2014 | Benson et al. |
| 2015/0171316 | A1 | 6/2015 | Park et al. |
| 2015/0270180 | A1 | 9/2015 | Yang |
| 2015/0286106 | A1 | 10/2015 | Yang et al. |
| 2016/0372656 | A1 | 12/2016 | Pinarbasi et al. |

FOREIGN PATENT DOCUMENTS

| | | |
|---|---|---|
| JP | 2001154221 A | 6/2001 |
| JP | 2005010407 A | 1/2005 |
| JP | 2009047902 A | 3/2009 |
| JP | 2012098726 A | 5/2012 |
| JP | 2012137738 A | 7/2012 |
| JP | 2014112238 A | 6/2014 |
| JP | 2015084324 A | 4/2015 |
| JP | 2015166856 A | 9/2015 |
| KR | 20120046040 A | 5/2012 |
| KR | 20160009669 A | 1/2016 |
| TW | I420283 B | 12/2013 |
| TW | I504996 B | 10/2015 |
| WO | 2015022887 A1 | 2/2015 |
| WO | 2015029704 A1 | 3/2015 |
| WO | 2015178299 A1 | 11/2015 |

OTHER PUBLICATIONS

Examination Report dated Sep. 8, 2017 for Australian Patent Application No. 2017216463 of Essential Products, Inc.
Extended European Search Report dated Apr. 6, 2018 in European Patent Application No. 17733337.4, 10 pages.
International Search Report and Written Opinion dated Aug. 16, 2017 for International Application No. PCT/US2017/036055, 7 pages.
Non-Final Office Action dated Feb. 10, 2017 in U.S. Appl. No. 15/233,818 of Evans V, D. et al. filed Aug. 10, 2016, 7 pages.
Notice of Acceptance of Patent Application dated Sep. 14, 2017 for Australian Patent Application No. 2017216463 of Essential Products, Inc.
Notice of Allowability dated Jun. 8, 2017 in U.S. Appl. No. 15/233,818 of Evans V, D. et al. filed Aug. 10, 2016, 9 pages.
Notice of Allowance dated Sep. 25, 2017 for U.S. Appl. No. 15/625,686 of Evans et al., filed Jun. 16, 2017.
Notice of Reason for Rejection dated Mar. 18, 2018 in Korean Patent Application No. 2017-7017919, 4 pages.
Notification of Reasons for Refusal dated Jun. 8, 2018 for Japanese Patent Application No. 2017-535683 of Essential Products, Inc.
Office Action dated Apr. 3, 2018 in Taiwan Patent Application No. 106119156, 13 pages, with English Translation.
Search Report dated Oct. 30, 2017 in Taiwan Patent Application No. 106119156 of Essential Products, Inc.
U.S. Appl. No. 15/626,588 of Evans V et al. filed Jun. 19, 2017.

* cited by examiner

HOLLOWED ELECTRONIC DISPLAY

CROSS-REFERENCE TO RELATED APPLICATIONS

This application is a continuation of a U.S. utility patent application Ser. No. 15/625,686, filed on Jun. 16, 2017, which is a continuation of the U.S. utility patent application Ser. No. 15/233,818, filed Aug. 10, 2016, now U.S. Pat. No. 9,735,185, which claims priority to U.S. provisional patent application Ser. No. 62/348,421, filed Jun. 10, 2016, all of which are incorporated herein in their entirety and by this reference thereto.

TECHNICAL FIELD

The present application is related to manufacturing of electronic displays and, more specifically, to methods and systems to manufacture hollowed electronic displays.

BACKGROUND

Electronic displays disposed on a side of mobile devices of today do not occupy the full side of the mobile device because certain areas of the mobile device are reserved for various sensors, such as a camera, ambient light sensor, proximity sensor, etc. The areas containing the sensors are considerably larger than the sensors, and those areas do not function as a part of the display. As a result, the size of the electronic display is reduced. Further, the manufacturing techniques used in the creation of the electronic displays are optimized for manufacture of rectangular electronic displays.

SUMMARY

Presented here are manufacturing techniques to create an irregularly shaped electronic display, including a hollow within which a sensor, such as a camera, can be placed. The manufacturing techniques enable the creation of the hollow anytime during the manufacturing process. The resulting electronic display occupies the full side of the mobile device, with the sensors placed within and surrounded by the display.

DETAILED DESCRIPTION

Technology

Figure 1A:
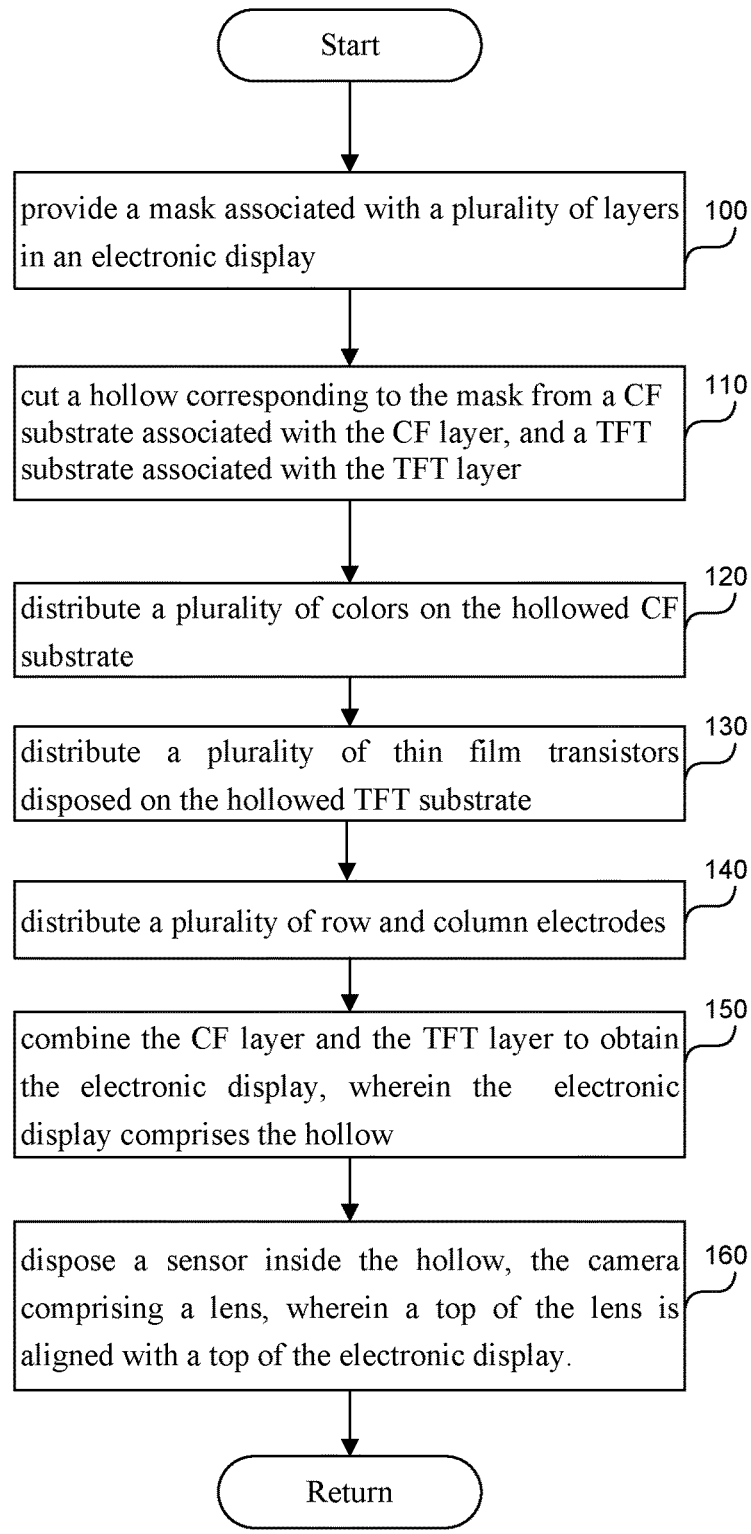
FIG. 1A is a flowchart of a method to create a hollowed electronic display and place a sensor, such as a camera, an ambient light sensor, and/or a proximity sensor, inside the hollow, according to one embodiment.

Presented here are manufacturing techniques to create an irregularly shaped electronic display, including a hollow within which a sensor, such as a camera, can be placed. The manufacturing techniques enable the creation of the hollow anytime during the manufacturing process. The resulting electronic display occupies the full side of the mobile device, with the sensors placed within and surrounded by the display.

The process of making electronic displays, such as liquid crystal displays (LCDs), organic light emitting diode (OLED) displays, and micro-electromechanical system (MEMS) displays, involves the creation of multiple layers. Multiple layers include a thin film transistor (TFT) layer, a color filter (CF) layer, and a display layer, which includes display elements such as liquid crystals, OLEDs, MEMS, etc. Each TFT in the TFT layer is connected to an intersection of rows and columns of electrodes. The rows of electrodes are connected to a first integrated circuit, called the row driver, which determines which electrode rows to activate by applying voltage to the ends of the row electrode. The columns of electrodes are connected to a second integrated circuit, the column driver, which determines which electrode columns to activate by applying voltage to the ends of the column electrode. The TFT is activated when both the row and the column electrode are activated. When the TFT is activated, the TFT in turn activates a corresponding display element which transmits light. The light, transmitted by the display element, is colored by a corresponding color region in the CF layer to produce any color in the visible spectrum. In addition, the light transmitted by the display element can include a frequency outside of the visible spectrum, such as infrared (IR). A group of one TFT, a corresponding display element, and a corresponding color region associated with the CF layer form a sub pixel.

Creating the TFT layer includes multiple steps. First, thin film transistors (TFTs) are deposited onto a substrate, such as a glass substrate or a plastic substrate. Afterwards, a photoresist coating is placed on the TFT coating.

In the photo development step, the photoresist coating is exposed to light, such as ultraviolet (UV) light. A photomask is used to selectively shade the photoresist coating from the light. The pattern on the photomask is transferred onto the photoresist coating. The photo development step varies based on the type of the photoresist coating. Photoresist coating can be either positive or negative. When the photoresist coating is positive, the photo development process removes the photoresist coating that was exposed to the light. When the photoresist coating is negative, the photo development process removes the photoresist coating that was not exposed to the light.

The etching step removes the TFT coating that is not protected by the photoresist. The stripping step removes the remaining photoresist coating from the TFTs by spraying organic solvent onto the substrate, thus leaving only the TFTs on the substrate in the areas that were protected by the photoresist coating during the etching step.

Creation of the TFT layer can include steps in addition to the steps described herein. Further, one or more of the steps described herein can be repeated multiple times.

Creating the CF layer involves multiple steps, some of which are described herein. First, a black photoresist is deposited on a substrate, such as a glass substrate. Next, the black photoresist on the substrate is treated with heat to remove solvents. The black photoresist is exposed to light through a photomask. The shape of the photomask can be grid-like, or a modified grid with various shapes added to the grid. The black photoresist is exposed to light, such as the UV light, through the photomask. In the photo development step, either the photoresist that was exposed to the light (positive photoresist) or the photoresist that was not exposed to the light (negative photoresist) is removed.

Next, the color regions, such as red, green, blue, cyan, magenta, yellow, white, infrared (IR), etc., are added to the substrate with the remaining black photoresist. The substrate is coated with a single color photoresist, such as a red photoresist, and prebaked to remove solvents. The red photoresist is exposed to light through a photomask. The photomask can take on various shapes. In the photo development step, either the red photoresist that was exposed to the light (positive photoresist) or the red photoresist that was not exposed to the light (negative photoresist) is removed from the substrate. To add additional colors, such as green, blue, cyan, magenta, yellow, white, infrared (IR), etc., the substrate is coated with a green photoresist and a blue photoresist, and the steps of exposure and photo development are repeated.

Creating the display layer includes depositing sealant on either the TFT layer or the CF layer. The shape of the sealant defines the perimeter of the electronic display. Inside the sealant, display elements are deposited, such as liquid crystals, OLEDs, MEMS, etc.

FIG. 1A is a flowchart of a method to create a hollowed electronic display and place a sensor, such as a camera, an ambient light sensor, and/or a proximity sensor, inside the hollow, according to one embodiment. In this method, a hollow is created in the electronic display before depositing the various elements such as color regions, the TFTs, the display elements, etc. on various substrates.

In step 100, a mask associated with a plurality of layers in an electronic display is provided. The electronic display can be a flat panel display and include a color filter (CF) layer, a thin film transistor (TFT) layer, and a display layer. Each layer in the plurality of layers can have substantially the same shape. The mask can be shaped like a circle, an ellipse, a square, a rectangle, a square with one or more rounded corners, a rectangle with one or more rounded corners, etc. The mask can be disposed anywhere on the electronic display, such as proximate to a top edge associated with the electronic display, in the middle of the electronic display, in a corner associated with electronic display, along the sides of the electronic display, etc.

In one embodiment, the edge of the mask traces a sub pixel boundary. Given that the size of a sub pixel is significantly smaller than the size and curvature of the mask, the edge of the mask appears smooth, and no sub pixel outline is visible along the mask edge. In another embodiment, shown in FIG. 1B, the edge of the mask does not align with the sub pixel boundary.

In step 110, a hollow corresponding to the mask is removed from a CF substrate associated with the CF layer and from a TFT substrate associated with the TFT layer to create a hollowed substrate. The hollowed substrate includes a CF substrate and a hollowed TFT substrate. Removing the hollow corresponding to the mask can be done in various ways, including cutting and/or etching. Cutting the hollow can be done with a laser or a diamond saw. The laser can be a Corning Laser Technologies laser, which cuts the glass with ultra-short laser pulses lasting several picoseconds. Etching can be done by coating the CF substrate and the TFT substrate with an etching-resistant coating. The etching-resistant coating is distributed everywhere on the CF substrate and the TFT substrate, except for the hollow corresponding to the mask. The coated CF substrate and the coated TFT substrate are submerged in the etcher, which removes the substrate in the uncoated areas. In the next step, the etching-resistant coating is removed from both the CF substrate and the TFT substrate.

In step 120, a plurality of colors are distributed on the hollowed CF substrate. The CF substrate can be made out of various materials, such as glass, plastic, etc. The plurality of colors are distributed to follow the outline of the hollowed CF substrate, without depositing any colors in the substrate hollow corresponding to the mask. The colors are filters that pass various frequency bands of the electromagnetic spectrum, such as red, green, blue, white, infrared (IR), cyan, magenta, yellow, etc.

In step 130, a plurality of thin film transistors is disposed on the hollowed TFT substrate. The TFT substrate can be made out of various materials, such as glass, plastic, etc. The plurality of TFTs are distributed to follow the outline of the hollowed TFT substrate, without depositing any TFTs in the substrate hollow corresponding to the mask.

In step 140, a plurality of row and column electrodes corresponding to the plurality of thin film transistors are distributed such that each row and column electrode in the plurality of row and column electrodes interrupted by the hollow partially follows a perimeter associated with the hollow. The distribution pattern is further explained in FIG. 1B. Step 140 can be performed before the plurality of TFTs are deposited on the TFT substrate, and/or after the plurality of TFTs are deposited on the TFT substrate.

In step 150, the CF layer and the TFT layer are combined to obtain the electronic display. The electronic display comprises a hollow corresponding to the mask. The hollow can have the same shape as the mask. Combining the CF layer and the TFT layer includes depositing a sealant on either the CF layer or the TFT layer. Depositing the sealant includes tracing the perimeter of the hollowed substrate. Once the sealant is deposited, the display elements are deposited inside the area enclosed by the sealant. The display elements can be liquid crystals, OLEDs, or MEMS.

In step 160, a sensor, such as a camera, an ambient light sensor, and/or a proximity sensor, is disposed inside the hollow such that the top of the sensor is aligned with the top of the electronic display. For example, the top of the camera comprises a lens associated with the camera. The camera lens is aligned with the top of the electronic display and placed beneath a cover glass associated with an electronic device.

Figure 1B:
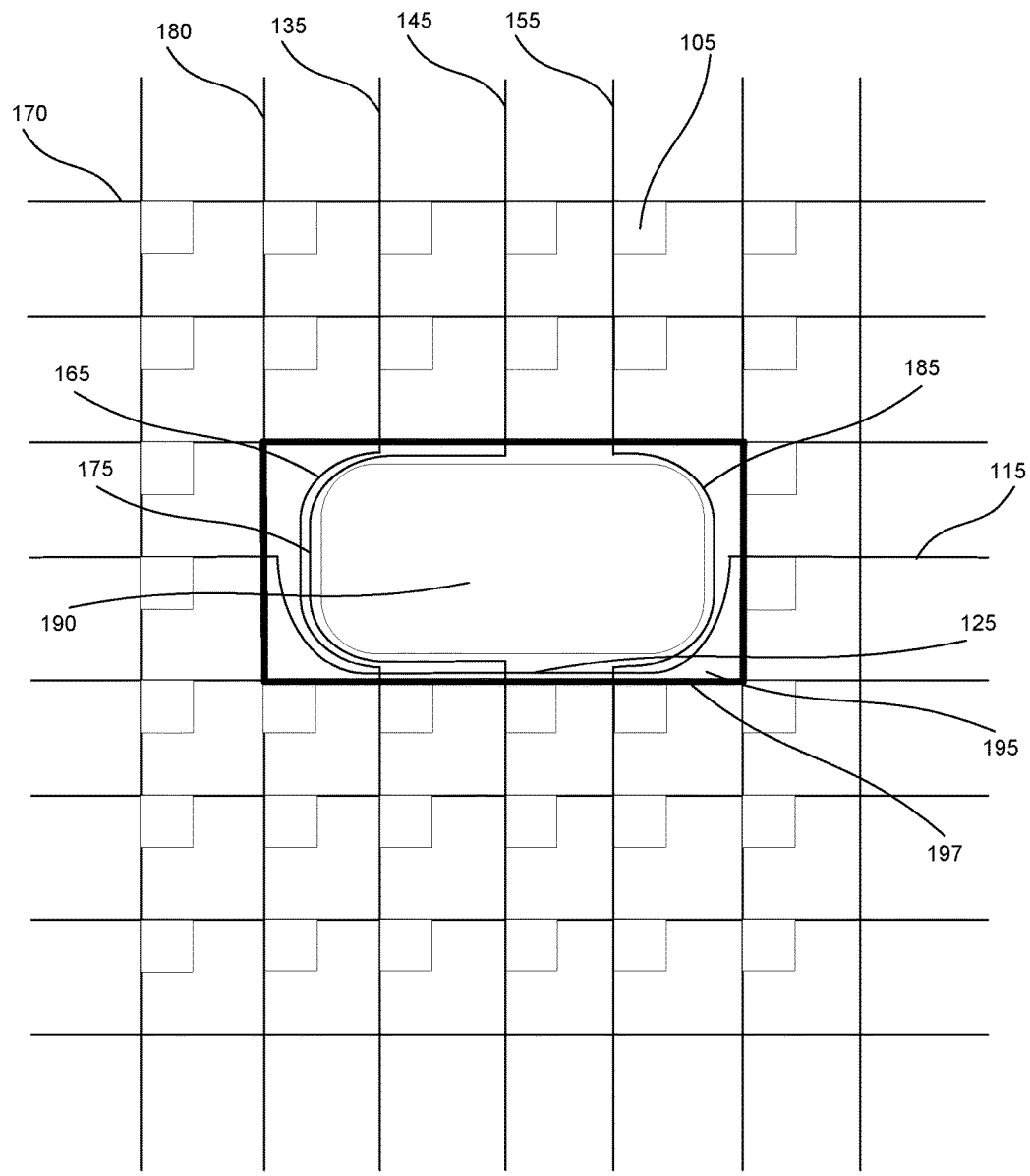
FIG. 1B shows the distribution pattern associated with the plurality of row and column electrodes, according to one embodiment.

FIG. 1B shows the distribution pattern associated with the plurality of row and column electrodes, according to one embodiment. The plurality of row electrodes 170 (only one row electrode labeled for brevity) and the plurality of column electrodes 180 (only one column electrode labeled for brevity) are distributed on the substrate in a modified grid-like pattern circumventing the hollow 190 corresponding to the mask. A thin film transistor 105 is disposed at an intersection of a row electrode and a column electrode (only one thin film transistor is labeled for brevity). Segment 125 of the row electrode 115 interrupted by the hollow 190 partially follows the perimeter associated with the hollow 190. There can be multiple row electrodes interrupted by the hollow 190. Similarly, segments 165, 175, 185 of the respective column electrodes 135, 145, 155 interrupted by the hollow 190 partially follow the perimeter associated with the hollow 190.

The mask corresponding to the hollow 190 does not follow a sub pixel boundary, and the formation of the hollow 190 creates an area 195 of partially formed pixels. The area 195 is bounded by the sub pixel boundary 197. The area 195 comprising the partially formed sub pixels is not part of the electronic display, and is used to layout the row electrode segment 125 and the plurality of column electrode segments 165, 175, 185 to circumvent the hollow 190.

Figure 2A:
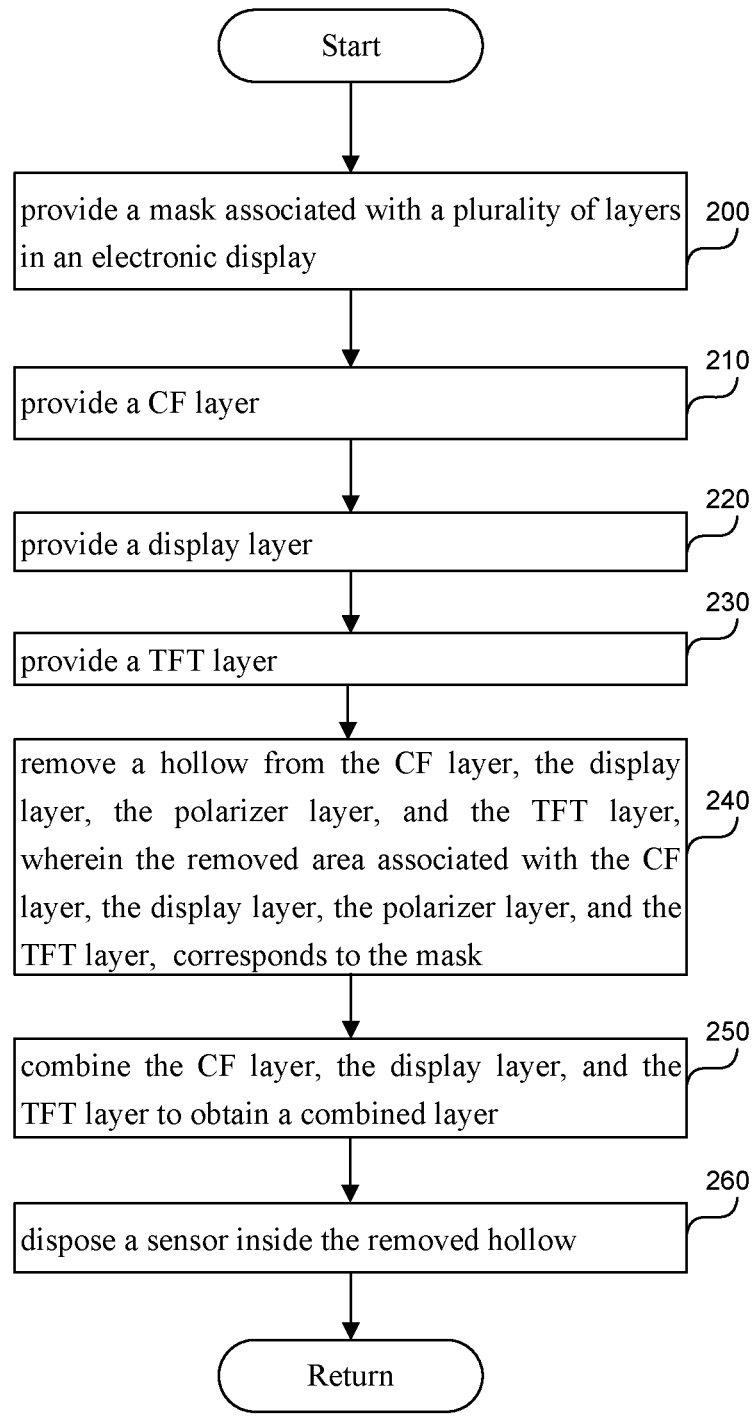
FIG. 2A is a flowchart of a method to create a hollowed electronic display and place a sensor, such as a camera, an ambient light sensor, and/or a proximity sensor, inside the hollow, according to another embodiment.

FIG. 2A is a flowchart of a method to create a hollowed electronic display and place a sensor, such as a camera, an ambient light sensor, and/or a proximity sensor, inside the hollow, according to another embodiment. In this method, a hollow is created in the electronic display after depositing the various elements such as color regions, the TFTs, the display elements, etc. on various substrates. In this method, there is no need to modify the manufacturing machinery to avoid depositing the various elements inside the hollow formed within the substrates. Even though depositing the various elements inside the hollow increases the amount of discarded material, the low cost of the discarded material, and the lack of need to modify the manufacturing machinery make this method cost-efficient.

In step 200, a mask corresponding to a plurality of layers in the electronic display is provided. The electronic display can be a flat panel display and include a color filter (CF) layer, a thin film transistor (TFT) layer, a polarizer layer, and a display layer. Each layer in the plurality of layers can have substantially the same shape. The mask can be shaped like a circle, an ellipse, a square, a rectangle, a square with one or more rounded corners, a rectangle with one or more rounded corners, etc. The mask can be disposed anywhere on the electronic display, such as proximate to a top edge associated with the electronic display, in the middle of the electronic display, in a corner associated with electronic display, along the sides of the electronic display, etc.

In one embodiment, the edge of the mask traces a sub pixel boundary. Given that the size of a sub pixel is significantly smaller than the size and curvature of the mask, the edge of the mask appears smooth, and no sub pixel outline is visible along the mask edge. When the edge of the mask traces the sub pixel boundary, only regions corresponding to whole sub pixels are removed, and no partially formed sub pixels remain.

In another embodiment, the edge of the mask does not trace the sub pixel boundary. Once a hollow corresponding to the mask is removed from the substrate, the partially formed sub pixels do not function as part of the display. Instead, the area 195 in FIG. 1B comprising the partially formed sub pixels is used to layout the plurality of row and column electrodes in a pattern circumventing the hollow, as shown in FIG. 1B.

In step 210, the CF layer is provided. The CF layer includes a CF substrate and a plurality of color regions disposed on the CF substrate. The substrate can be made out of various materials such as glass, plastic, etc. The color regions are filters that pass various bands of the electromagnetic spectrum such as red, green, blue, white, infrared (IR), cyan, magenta, yellow, etc.

Providing the CF substrate includes depositing a colored photoresist coating onto the CF substrate. The colored photoresist coating includes filters that pass various bands of the electromagnetic spectrum such as red, green, blue, white, infrared (IR), cyan, magenta, yellow, black, etc.

Figure 2B:
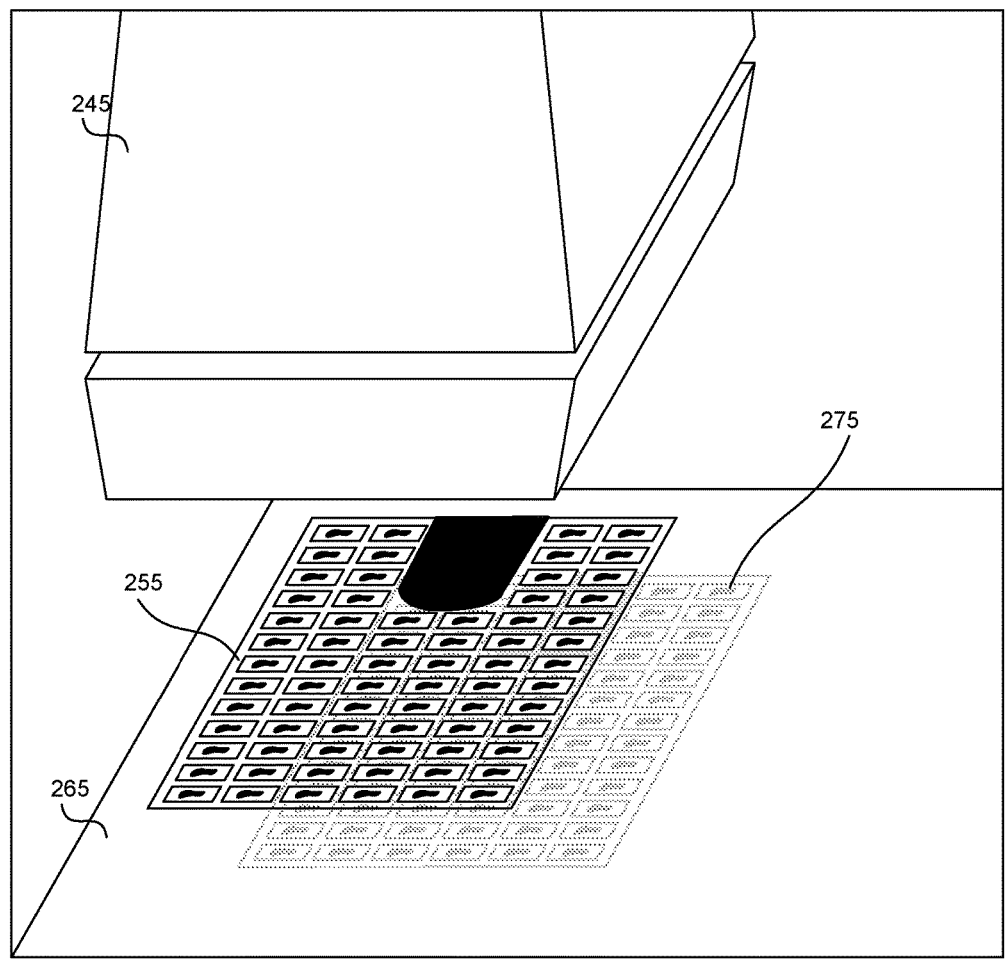
FIG. 2B shows an exposure of a substrate to light using a photomask, according to one embodiment.

The colored photoresist is exposed to light, such as the UV light, through a photomask. FIG. 2B shows an exposure of a substrate to light using a photomask, according to one embodiment. A light source 245 transmits light, such as the UV light, and illuminates the substrate 265 through the photomask 255. The substrate 265 can be the CF substrate, the TFT substrate, etc. The pattern on the photomask 255 is transferred onto the photoresist coating to form a pattern 275.

Figure 2C:
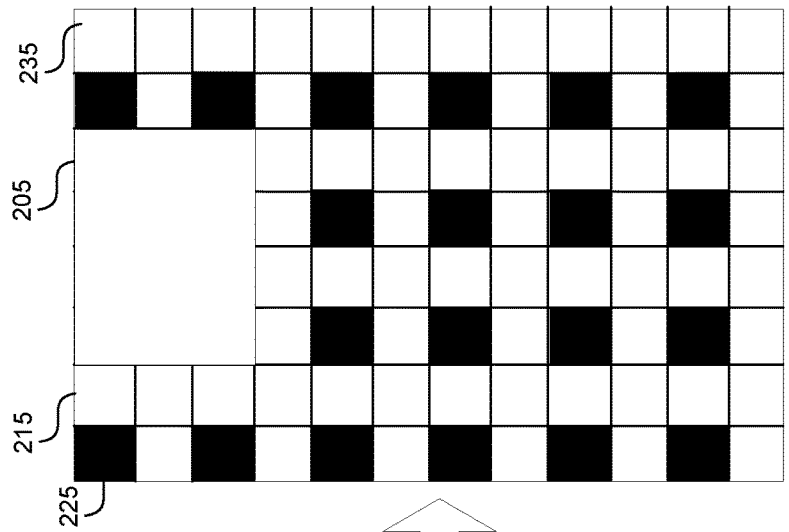
FIG. 2C shows the modified photomask, according to one embodiment.
Figure 2C:
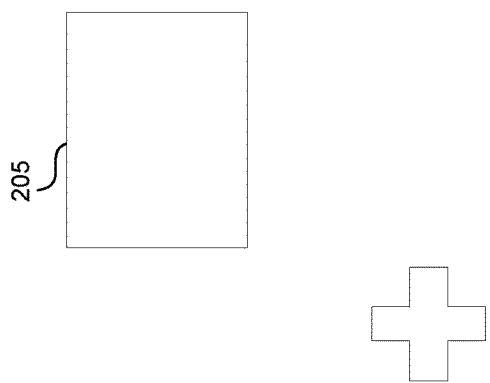
Figure 2C:
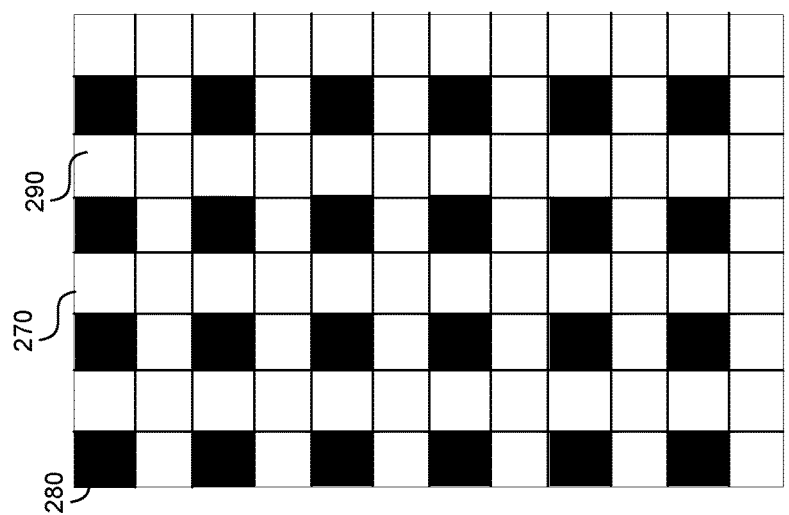

The photomask can take on various shapes. In one embodiment, the photomask is modified based on the provided mask. FIG. 2C shows the modified photomask, according to one embodiment. Element 270 is the unmodified photomask, including the plurality of protected areas 280 (only one of which is labeled in the figure for brevity), and the plurality of unprotected areas 290 (only one of which is labeled in the figure for brevity). Element 205 corresponds to the mask used in modifying the photomask 270. The modified mask 215 includes a plurality of protected areas 225 (only one of which is labeled in the figure for brevity), and a plurality of unprotected areas 235 (only one of which is labeled in the figure for brevity), where the plurality of unprotected areas 235 include the mask 205.

Finally, the plurality of unprotected areas 235 are removed from the substrate using a photo development process. In the photo development step, if the photoresist is positive, the photoresist that is exposed to the light is removed from the substrate, and if the photo is negative, the photoresist that is not exposed to the light is removed from the substrate. To add additional colors, such as green, blue, yellow, magenta, black, white, cyan, IR, etc., the substrate is coated with an appropriately colored photoresist, and the steps of exposure and photo development are repeated.

In step 220 of FIG. 2A, a display layer is provided, which includes a plurality of display elements disposed between the CF layer and the TFT layer. The plurality of display elements are configured to transmit light and can include liquid crystals, OLEDs, MEMS, etc. Providing the display layer includes depositing a sealant, and depositing a plurality of display elements inside the sealant. The sealant is deposited on a layer in the plurality of layers, such as the CF layer or the TFT layer. The shape of the sealant traces at least a partial outline associated with the electronic display, element 730 in FIG. 7, and an outline associated with the mask, element 740 in FIG. 7. The display elements are deposited inside the outline defined by the sealant.

In step 230 of FIG. 2A, the TFT layer is provided, which includes a TFT substrate and a plurality of transistors disposed on the TFT substrate. The TFT substrate can be made out of various materials such as glass, plastic, etc. Providing the TFT layer includes depositing TFTs, depositing a photoresist coating, modifying a photomask, and removing a plurality of unprotected areas from the substrate. Initially, TFTs are deposited onto the TFT substrate. A photoresist coating is deposited on the thin film transistors. The photoresist is exposed to light, such as the UV light, through a photomask, as shown in FIG. 2B and described herein. The photomask can take on various shapes. In one embodiment, the photomask is modified based on the provided mask, as shown in FIG. 2C and described herein. The photomask includes a plurality of protected areas and a plurality of unprotected areas.

Finally, the plurality of unprotected areas are removed to leave TFTs disposed on the TFT substrate in the plurality of protected areas. The removal of the unprotected areas can be done using photo development, etching and stripping. In the photo development step, either the photoresist that was exposed to the light (positive photoresist) or the photoresist that was not exposed to the light (negative photoresist) is removed from the substrate. In the etching step, the TFTs in the areas where the photoresist was removed are etched away, leaving only TFTs and the photoresist coating in the plurality of protected areas. In the stripping step, the photoresist is removed from the substrate, leaving only TFTs in the plurality of protected areas.

In addition, providing the TFT layer includes distributing a plurality of row and column electrodes corresponding to the plurality of thin film transistors such that each row and column electrode in the plurality of row and column electrodes interrupted by the hollow partially follows a perimeter associated with the hollow. The distribution pattern is further explained in FIG. 1B. Distributing the plurality of row and column electrodes can be performed before the plurality of TFTs are deposited on the TFT substrate, and/or after the plurality of TFTs are deposited on the TFT substrate.

In step 240, a hollow is removed from the CF layer, the display layer, the polarizer layer, and the TFT layer, wherein the removed hollow corresponds to the provided mask. Since the edge of the mask traces the sub pixel boundary, only regions corresponding to whole sub pixels are removed, and no partially formed sub pixels remain. Removing the hollow corresponding to the mask can be done in various ways, including cutting and/or etching. Cutting the hollow can be done with a laser or a diamond saw. The laser can be a Corning Laser Technologies laser, which cuts the glass with ultra-short laser pulses lasting several picoseconds. Etching can be done by coating the CF substrate, the display layer, the polarizer layer, and the TFT substrate with an etching-resistant coating. The etching-resistant coating is distributed everywhere on the CF layer, the display layer, the polarizer layer, and the TFT layer, except for the hollow corresponding to the mask. The coated CF layer, the coated display layer, the coated polarizer layer, and the coated TFT layer are submerged in the etcher, such as a chemical etcher, which removes the substrate in the uncoated areas. In the next step, the etching-resistant coating is removed from the CF substrate, the display layer, the polarizer layer, and the TFT substrate. In one embodiment, the polarizer layer is specially manufactured to be stamped with a polarizing material, where the stamp is in the shape of the hollowed substrate. By stamping the polarizer to exclude the mask, the amount of polarizing material discarded is reduced.

In step 250, the CF layer, the display layer, and the TFT layer are combined to obtain a combined layer. Step 240 can be performed before step 250. That is, the hollow can be removed from each layer in the electronic display separately. Alternatively, step 240 can be performed after step 250, meaning that the hollow can be removed once from the combined layer.

In step 260, a sensor, such as a camera, an ambient light sensor, and/or a proximity sensor, is disposed inside the removed hollow, with the top of the sensor aligned with the top of the electronic display. For example, the top of the camera comprises a lens associated with the camera. The camera lens is aligned with the top of the electronic display and placed beneath a cover glass associated with an electronic device.

Figure 3:
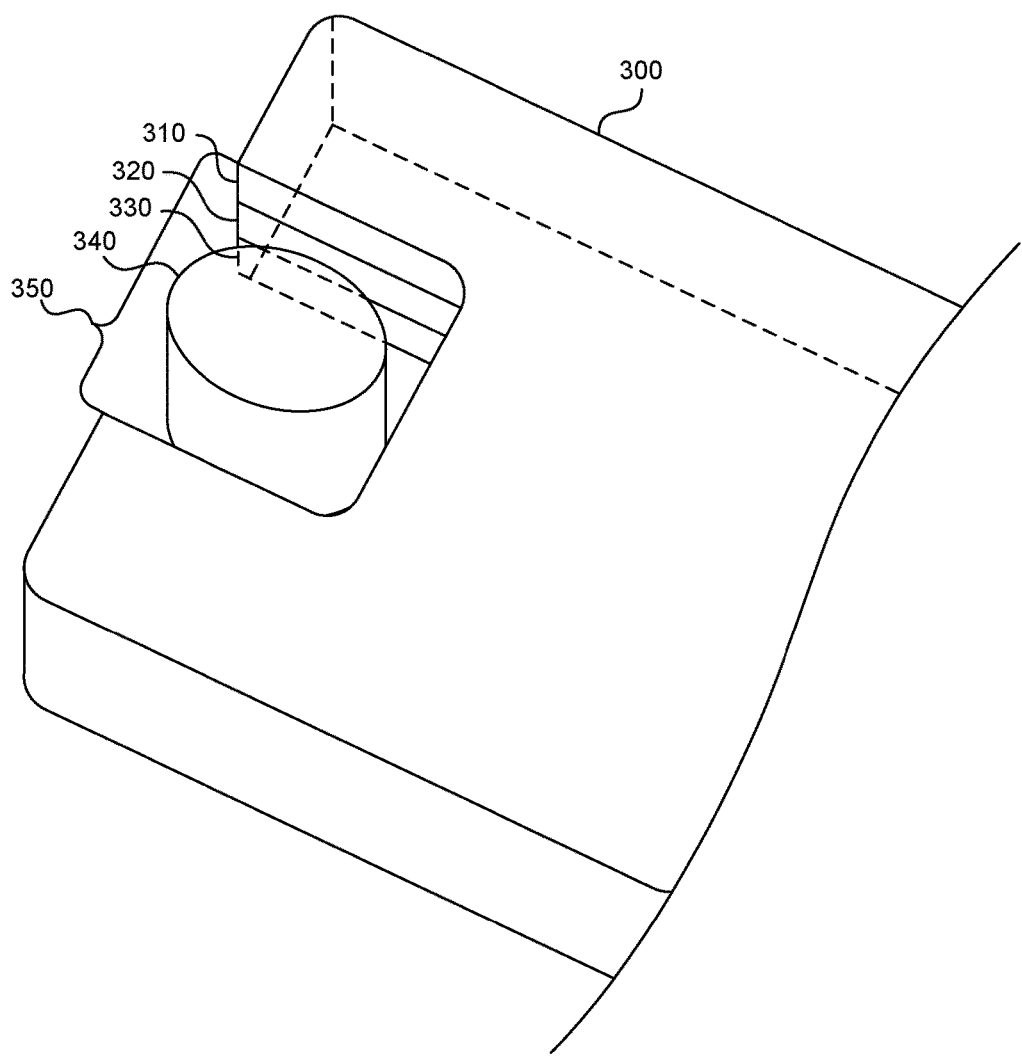
FIG. 3 shows a sensor disposed within a hollow associated with an electronic display, according to one embodiment.

FIG. 3 shows a sensor disposed within a hollow associated with an electronic display, according to one embodiment. An electronic display 300, such as a flat panel display, includes a color filter (CF) layer 310, a display layer 320, a thin film transistor (TFT) layer 330, and a sensor 340, such as a camera, an ambient light sensor, and/or a proximity sensor. The electronic display 300 can include additional layers, such as a polarizer layer, a light guide plate, a diffuser layer, etc. The display layer 320 can include liquid crystals, organic light emitting diodes, or micro-electromechanical system (MEMS) devices. The sensor 340 is disposed within a hollow 350 formed in the electronic display 300. The hollow 350 can take on different shapes, such as a rectangular shape with one or more rounded corners, as shown in FIG. 3. In addition, the hollow 350 can take on a rectangular shape with sharp corners, an elliptical shape, a circular shape, a square shape, etc. A top surface of the sensor 340 can be disposed at the same height as the top surface of the electronic display 300. Also, the top surface of the sensor 340 can be slightly recessed from the top surface of the electronic display 300. The sensor 340 is optically isolated from the electronic display 300 so that light from the electronic display 300 does not reach the sensor 340. The sensor 340 can be isolated using an optically opaque material surrounding the sensor 340 and extending to the cover glass.

Figure 4:
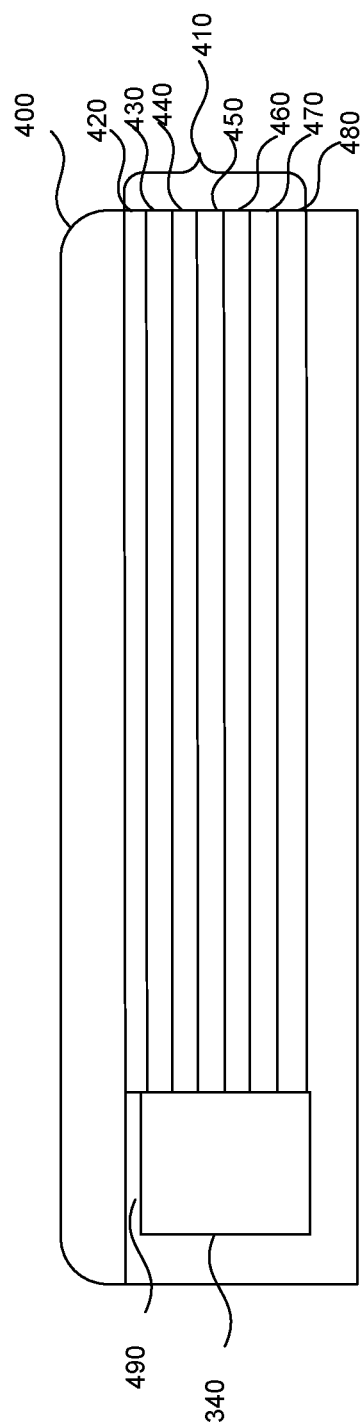
FIG. 4 shows a side view of the sensor disposed within the hollow associated with the electronic display, according to one embodiment.

FIG. 4 shows a side view of the sensor disposed within the hollow associated with the electronic display, according to one embodiment. Cover glass 400 is disposed above the electronic display 410 and the sensor 340. The top surface of the sensor 340 and the top surface of the electronic display 410 can be at the same height. Also, the top surface of the sensor 340 can be slightly recessed from the top surface of the electronic display 410, thus forming an air gap 490 between the top surface of the sensor 340 and the cover glass 400. In another embodiment, the electronic display 410 includes a top polarizer layer 420, a CF layer 430, a display layer 440, a TFT layer 450, a bottom polarizer layer 460, a diffuser 470, a light guide plate 480, and the sensor 340. The display layer 440 can include liquid crystals, organic light emitting diodes, or micro-electromechanical system (MEMS) devices. The sensor 340 is optically isolated from the electronic display 410 so that light from the electronic display 410 does not reach the sensor 340. The sensor 340 can be isolated using an optically opaque material surrounding the sensor 340 and extending to the cover glass 400.

Figure 5:
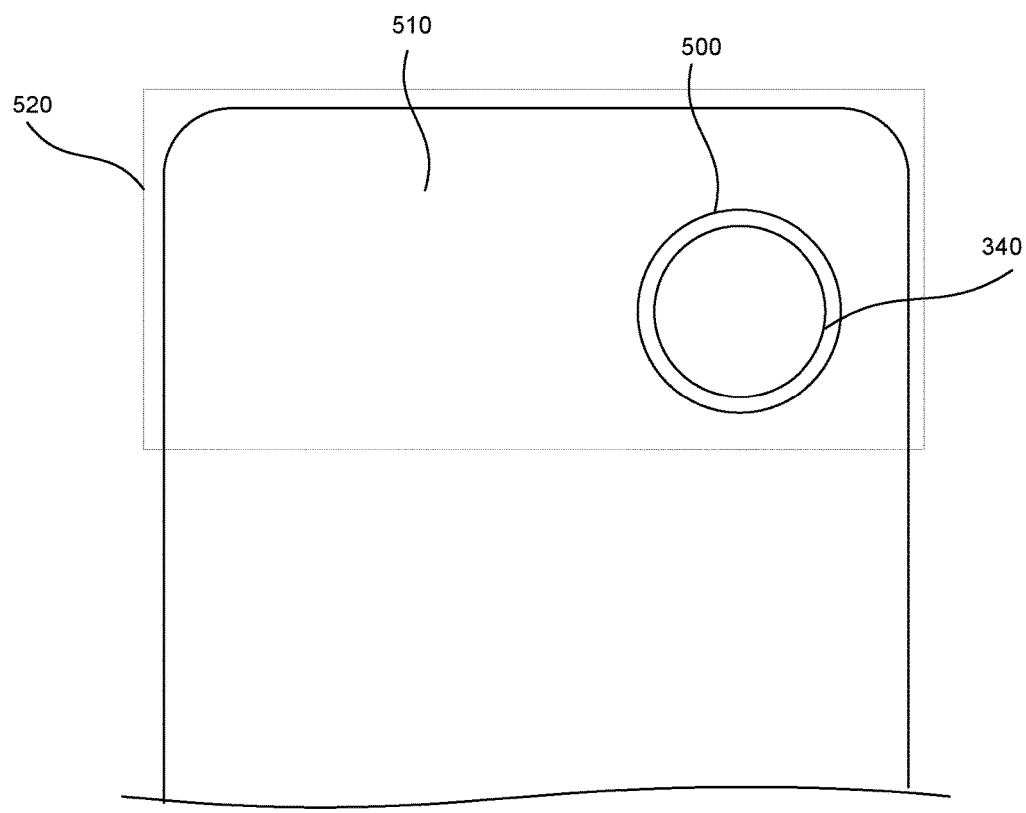
FIG. 5 shows a circular hollow associated with the electronic display, according to one embodiment.

FIG. 5 shows a circular hollow associated with the electronic display, according to one embodiment. The circular hollow 500 is formed inside an electronic display 510. The circular hollow 500 can be placed anywhere on the electronic display 510, such as the forehead 520 associated with the electronic display 510, as shown in FIG. 5, as well as the middle of the electronic display 510, middle left portion of the electronic display 510, middle right portion of the electronic display 510, bottom portion of the electronic display 510, etc. The sensor 340 is placed inside the circular hollow 500. The hollow on all sides is surrounded by the active electronic display 510.

Figure 6:
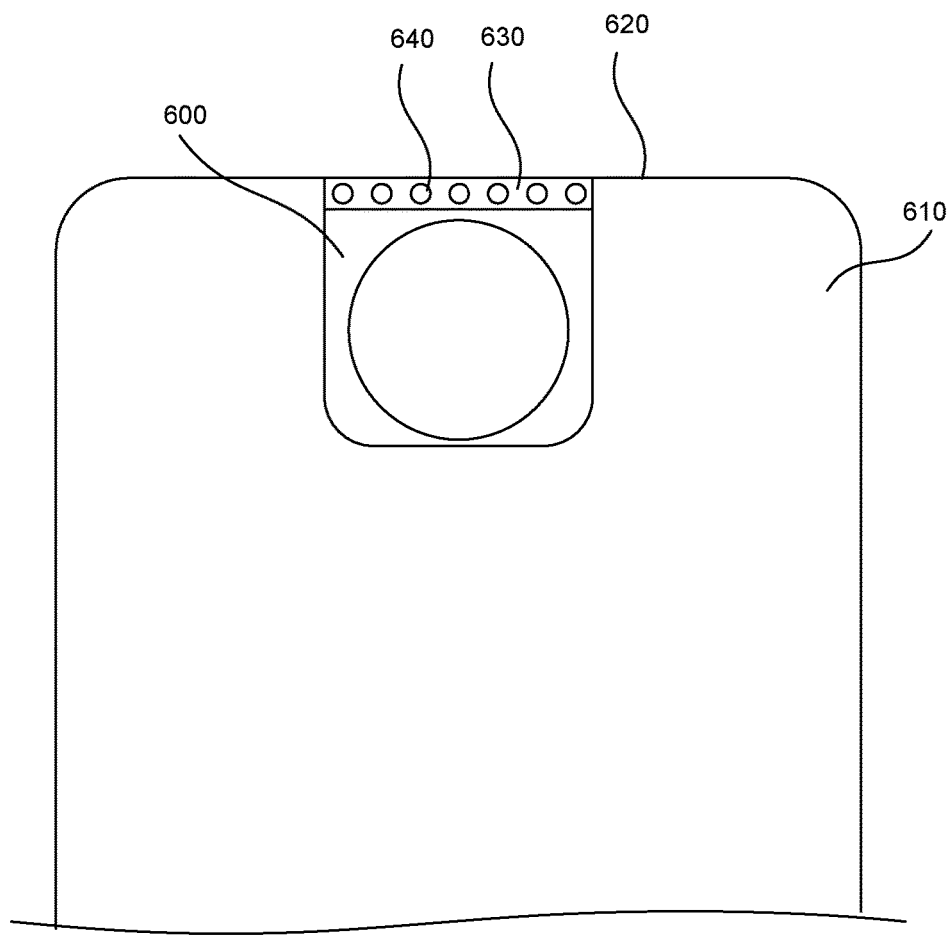
FIG. 6 shows a rectangular hollow associated with the electronic display, according to one embodiment.

FIG. 6 shows a rectangular hollow associated with the electronic display, according to one embodiment. The rectangular hollow 600 with two round angles is formed inside the electronic display 610. The rectangular hollow 600 can be placed anywhere on the electronic display 610, such as the forehead of the electronic display 610, the bottom left corner, the bottom right corner, middle left side, mid-right side, etc. When the rectangular hollow 600 is placed close to one edge associated with the electronic display 610, such as the edge 620, a thin portion 630 of the electronic display 610 formed between the rectangular hollow 600 and the edge 620 does not include active display elements. Instead, the thin portion 630 serves as a structural support for the electronic display 610. In one embodiment, a plurality of glue beads 640 are placed on the surface of the thin portion 630 to further provide structural support for the electronic display 610. In another embodiment, a sealant is placed on the surface of the thin portion 630 to further provide structural support for the electronic display 610.

Figure 7:
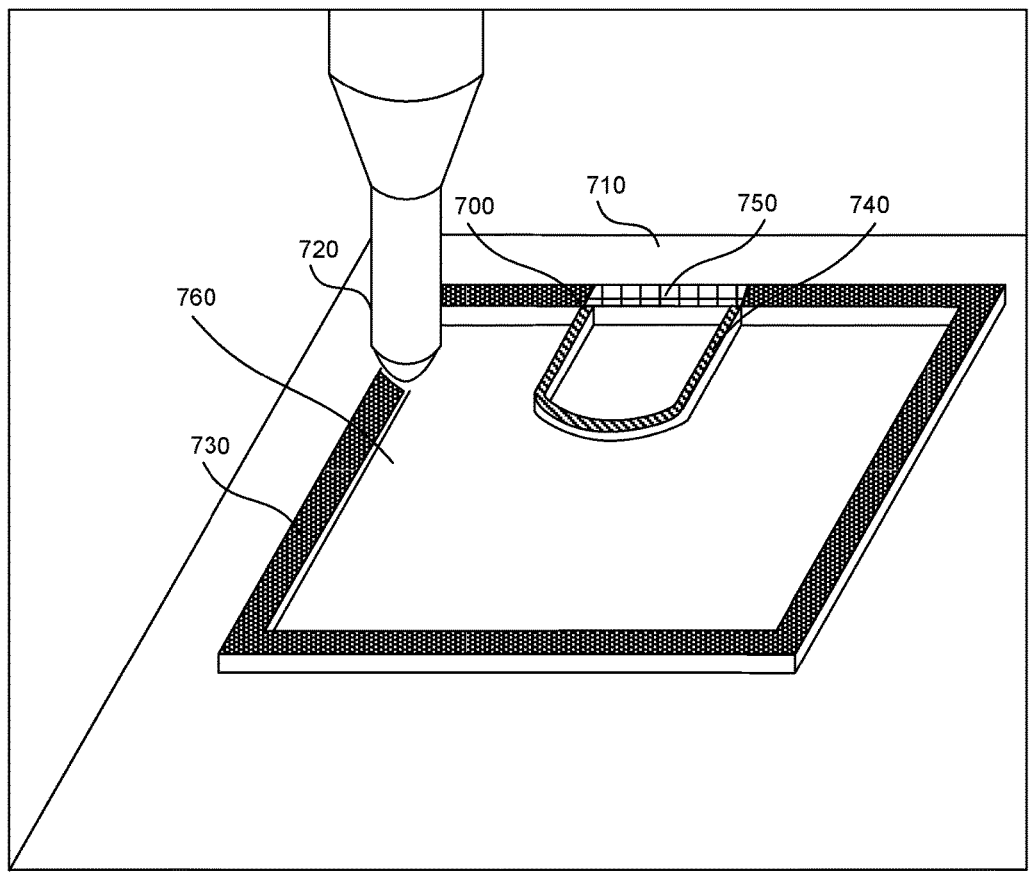
FIG. 7 shows a sealant disposed on a layer associated with the electronic display, according to one embodiment.

FIG. 7 shows a sealant disposed on a layer associated with the electronic display, according to one embodiment. The dispenser 720 disposes the sealant 700 on a layer 710 associated with the electronic display, such as the CF layer or the TFT layer. The shape of the sealant 700 traces the contour 730 of the electronic display and the contour 740 of the hollow. The sealant section 750 is optional and can be removed in some embodiments. When added, the sealant section 750 provides additional structural support to the electronic display. Display elements, such as liquid crystals, organic light emitting diodes, or MEMS, are deposited inside area 760. In other embodiments, the display elements are deposited inside the contour 730 of the electronic display, including the area defined by the contour 740 of the hollow.

Remarks

The language used in the specification has been principally selected for readability and instructional purposes, and it may not have been selected to delineate or circumscribe the inventive subject matter. It is therefore intended that the scope of the invention be limited, not by this Detailed Description but rather by any claims that issue on an application based hereon. Accordingly, the disclosure of various embodiments is intended to be illustrative, but not limiting, of the scope of the embodiments, which is set forth in the following claims.

The invention claimed is:

1. A system comprising:
    a color filter (CF) layer comprising a plurality of colors disposed on a CF substrate;
    a thin film transistor (TFT) layer comprising a plurality of transistors disposed on a TFT substrate, a shape associated with the CF layer corresponding to a shape associated with the TFT layer;
    a hollow formed within the CF layer and the TFT layer;
    a plurality of display elements disposed between the CF layer and the TFT layer, the plurality of display elements arranged in a shape corresponding to the shape associated with the CF layer, the plurality of display elements operable to transmit light; and
    a sensor disposed within the hollow.

2. The system of claim 1, comprising:
    a plurality of row and column electrodes associated with the plurality of display elements such that each row and column electrode in the plurality of row and column electrodes interrupted by the hollow circumvents the hollow.

3. The system of claim 1, comprising:
    a polarizer layer formed into the shape corresponding to the shape associated with the CF layer comprising the hollow.

4. The system of claim 1, comprising:
    a light guide plate and a diffuser, the light guide plate and the diffuser formed into a shape corresponding to the shape associated with the CF layer comprising the hollow.

5. The system of claim 1, comprising a sealant disposed within a perimeter of one of the CF layer and the TFT layer.

6. The system of claim 5, the shape associated with the plurality of display elements corresponding to a shape associated with the sealant.

7. The system of claim 1, the plurality of display elements comprising at least one of a liquid crystal display, an organic light emitting diode display (OLED), or a micro-electromechanical systems (MEMS) display.

8. A system comprising:
    a display layer comprising a plurality of display elements disposed on a display substrate, the plurality of display elements operable to transmit light;
    an activating layer comprising a plurality of activating elements disposed on an activating substrate, the plurality of activating elements to activate a display element in the plurality of display elements;
    a hollow formed within the activating layer and the display layer;
    a plurality of row and column electrodes corresponding to the plurality of activating elements such that each row and column electrode in the plurality of row and column electrodes interrupted by the hollow circumvents the hollow; and
    a sensor disposed within the hollow.

9. The system of claim 8, comprising:
    a polarizer layer defining a shape forming the hollow.

10. The system of claim 8, comprising:
    a light guide plate and a diffuser, the light guide plate and the diffuser defining a shape forming the hollow.

11. The system of claim 8, comprising a sealant disposed within a perimeter of at least one of the display layer, a polarizer layer or the activating layer.

12. The system of claim 8, the plurality of display elements comprising at least one of a liquid crystal display, an organic light emitting diode display (OLED), or a microelectromechanical systems (MEMS) display.

13. The system of claim 8, comprising an activated row electrode and an activated column electrode in the plurality of row and column electrodes activating a corresponding display element.

14. A method comprising:
    means for providing a mask corresponding to a plurality of layers in an electronic display, wherein the plurality of layers comprises a color filter (CF) layer, a display layer, and a thin film transistor (TFT) layer;
    means for providing the CF layer comprising a CF substrate and a plurality of color regions disposed on the CF substrate;
    means for providing the display layer comprising a plurality of display elements disposed between the CF layer and the TFT layer, the plurality of display elements configured to transmit light;
    means for providing the TFT layer comprising a TFT substrate and a plurality of transistors disposed on the TFT substrate;
    means for forming a hollow within the CF layer, the display layer, and the TFT layer, wherein the hollow associated with the CF layer, the display layer, and the TFT layer, corresponds to the mask;
    means for sealing the CF layer, the display layer, and the TFT layer to obtain a combined layer; and
    means for disposing a sensor inside the hollow.

15. The method of claim 14, comprising:
    means for depositing the plurality of transistors onto the TFT substrate, wherein the TFT substrate comprises glass;

means for depositing a photoresist coating on the plurality of transistors;

means for modifying a photomask to include the mask, wherein the modified photomask comprises a plurality of protected areas and a plurality of unprotected areas, and wherein the mask is associated with the plurality of unprotected areas; and means for removing the plurality of unprotected areas to leave the plurality of transistors disposed on the TFT substrate in the plurality of protected areas.

16. The method of claim 14, comprising:

means for depositing an etching-resistant sealant on the plurality of layers, wherein the etching-resistant sealant is not deposited on the hollow corresponding to the mask, and wherein the etching-resistant sealant protects the plurality of layers from an etcher;

means for submerging the plurality of layers in the etcher; and means for etching the hollow from the CF layer, the display layer, and the TFT layer, wherein the hollow associated with the CF layer, the display layer, and the TFT layer corresponds to the mask.

17. The method of claim 14, comprising:

upon said combining the CF layer, the display layer, and the TFT layer, means for forming the hollow within the combined layer, wherein the hollow corresponds to the mask.

18. The method of claim 14, wherein said forming the hollow comprises:

cutting with a diamond cutter the hollow from the CF layer, the display layer, and the TFT layer, wherein the hollow associated with the CF layer, the display layer, and the TFT layer corresponds to the mask.

19. The method of claim 14, wherein the mask comprises a rectangular shape with at least one rounded corner.

20. The method of claim 14, comprising:

means for distributing a plurality of row and column electrodes corresponding to the plurality of transistors such that each row and column electrode in the plurality of row and column electrodes interrupted by the hollow circumvents the hollow.

* * * * *